United States Patent
Kim et al.

[11] Patent Number: 6,025,248
[45] Date of Patent: Feb. 15, 2000

[54] METHODS OF FORMING CAPACITOR ELECTRODES INCLUDING A CAPACITOR ELECTRODE ETCH

[75] Inventors: Hee-seok Kim; Jae-chul Lee, both of Kyunggi-do; Hyun-woo Lim, Seoul; Jae-hyong Lee, Kyunggi-do, all of Rep. of Korea

[73] Assignee: Samsung Electronics Co., Ltd., Rep. of Korea

[21] Appl. No.: 08/946,334

[22] Filed: Oct. 7, 1997

[51] Int. Cl.7 ............................................. H01L 21/8242
[52] U.S. Cl. .................. 438/398; 438/253; 438/255; 438/396; 438/947; 438/964
[58] Field of Search ................................. 257/301, 303, 257/307, 308, 309; 438/253, 254, 255, 396, 397, 398, 947, 964

[56] References Cited

U.S. PATENT DOCUMENTS

| | | | |
|---|---|---|---|
| 5,134,086 | 7/1992 | Ahn | 438/398 |
| 5,350,707 | 9/1994 | Ko et al. | 438/398 |
| 5,492,848 | 2/1996 | Lur et al. | 438/396 |
| 5,670,407 | 9/1997 | Tseng | 438/396 |
| 5,681,774 | 10/1997 | Tseng | 438/396 |

*Primary Examiner*—Carl Whitehead, Jr.
*Assistant Examiner*—Toniae M. Thomas
*Attorney, Agent, or Firm*—Myers Bigel Sibley & Sajovec

[57] ABSTRACT

A method of forming a capacitor includes the step of forming an electrode on an integrated circuit substrate wherein the electrode covers a first portion of the integrated circuit substrate and wherein the electrode exposes a second portion of the integrated circuit substrate. An etch masking pattern including a plurality of ions is formed on the surface of the electrode wherein the etch masking pattern exposes portions of the surface of the electrode. The exposed portions of the electrode are etched using the etch masking pattern as an etching mask so that recesses are formed in the surface of the electrode thereby increasing a surface area thereof. The etch masking pattern is removed, a dielectric layer is formed on the electrode including the recesses, and a conductive layer is formed on the dielectric layer opposite the electrode.

32 Claims, 2 Drawing Sheets

METHODS OF FORMING CAPACITOR ELECTRODES INCLUDING A CAPACITOR ELECTRODE ETCH

FIELD OF THE INVENTION

The present invention relates to the field of integrated circuits and more particularly to methods of forming integrated circuit capacitors.

BACKGROUND OF THE INVENTION

As dynamic random access memories (DRAM) have become more highly integrated, there have been efforts to maintain desired storage capacitances for memory cell capacitors. In particular, there have been efforts to increase the surface areas of capacitor electrodes and to develop capacitor dielectric layers having relatively high dielectric constants. For example, electrode surface areas have been increased by forming hemispherical grains thereon. In addition, thin nitride films have been formed on storage node electrodes and then a plurality of micro pinholes have been formed in the thin nitride layer using a wet oxidation.

When using a polysilicon electrode with hemispherical grains formed thereon, it may be difficult to dope the undoped polysilicon layer with dopant ions. Furthermore, it may be difficult to maintain a desired hemispherical grain shape as a result of a suppression of silicon migration. In addition, the hemispherical structure may be damaged during ion implantation and/or $POCl_3$ deposition.

SUMMARY OF THE INVENTION

It is therefore an object of the present invention to provide improved methods of forming electrodes for integrated circuit capacitors.

It is another object of the present invention to provide methods of forming integrated circuit capacitors having increased capacitance.

It is still another object of the present invention to provide methods of forming integrated circuit capacitor electrodes having increased surface areas.

These and other objects are provided according to the present invention by methods including the step of forming an electrode on an integrated circuit substrate wherein the electrode covers a first portion of the integrated circuit substrate and wherein the electrode exposes a second portion of the integrated circuit substrate. An etch masking pattern including a plurality of islands is formed on a surface of the electrode wherein the etch masking pattern exposes portions of the surface of the electrode. The exposed portions of the surface of the electrode are etched using the etch masking pattern as an etching mask so that recesses are formed in the surface of the electrode thereby increasing a surface area of the electrode. The etch masking pattern is removed, a dielectric layer is formed on the electrode including the recesses, and a conductive layer is formed on the dielectric layer opposite the electrode. The capacitor thus formed has electrodes with increased surface areas thereby increasing the capacitance thereof. This method can thus be used advantageously to provide memory cell capacitors for highly integrated dynamic random access memory devices.

More particularly, the step of forming the etch masking pattern can include the steps of forming a masking layer on the surface of the electrode, and forming a silicon layer on the masking layer opposite the electrode. A plurality of oxide runners can be formed along grain boundaries of the silicon layer, and these oxide runners can be selectively removed thereby exposing portions of the masking layer along the grain boundaries. The exposed portions of the masking layer can then be etched thereby exposing the portions of the surface of the electrode. In addition, the step of forming the plurality of oxide runners can include a $POCl_3$ doping step. The etch masking pattern can thus be provided without the need for additional photolithography steps. Moreover, the $POCl_3$ doping step can also provide doping for surface portions of the storage node electrode 15.

Each of the oxide runners can be grown perpendicularly with respect to the masking layer, and the masking layer can be an oxide layer. Moreover, each of the steps of etching the exposed portions of the masking layer and removing the oxide runners can include a wet and/or a dry etch step.

The silicon layer can be a layer of polysilicon or amorphous silicon. In addition, the silicon layer can have a sheet resistance in the range of 30 $\Omega/\square$ to 100 $\Omega/\square$ after the step of forming the oxide runners. In addition, the oxide runners can include a material such as $SiO_2$ or $P_2O_5$.

According to the methods discussed above, the surface of a storage node electrode for an integrated circuit capacitor can be increased thereby increasing the capacitance. These methods can thus be used advantageously to provide memory cell capacitors for highly integrated memory devices.

DETAILED DESCRIPTION

Figure 1A:
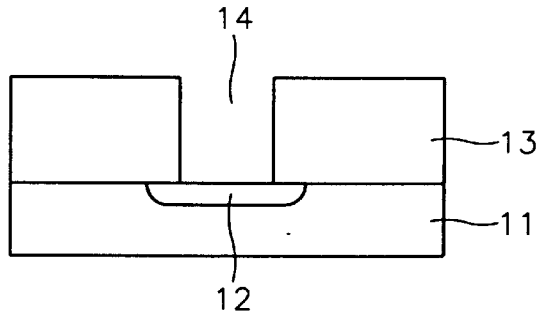
FIGS. 1A–1G are cross-sectional views illustrating steps of a method according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

A method of forming a capacitor according to the present invention will now be discussed with reference to FIGS. 1A through 1G. As shown in FIG. 1A, a semiconductor substrate 11 is selectively implanted with dopant ions to form the source/drain region 12, and an insulating layer 13 such as a borophosphosilicate glass (BPSG) layer is deposited on the semiconductor substrate 11. More particularly, a memory cell access transistor including the source/drain region 12 can be formed on the semiconductor substrate 11, and the insulating layer 13 can be formed on both the semiconductor substrate 11 and the memory cell access transistor. As it will be understood by those having skill in the art, a memory cell access transistor can be used to connect a memory cell capacitor to a bit line in response to a predetermined signal on a word line. The insulating layer 13 is then patterned to provide a contact hole 14 exposing a portion of the source/drain region 12.

Figure 1B:
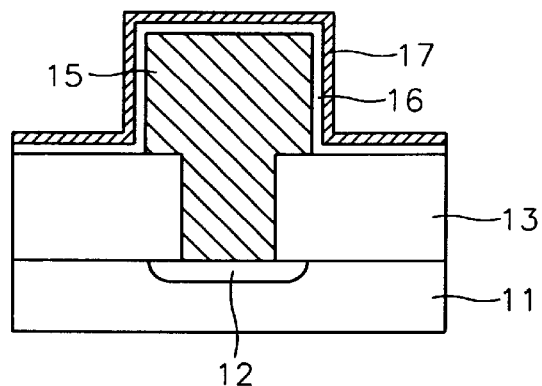

A polysilicon layer is then formed on the insulating layer 13, and the polysilicon layer is electrically connected to the source/drain region 12 through the contact hole 14. This polysilicon layer is patterned to provide the storage node electrode 15 as shown in FIG. 1B. Accordingly, the electrode 15 is electrically coupled to the source/drain region 12. Moreover, the storage node electrode 15 can be a storage node electrode for a memory cell capacitor of a DRAM wherein the contact hole provides electrical coupling with the source/drain region of a memory cell access transistor.

An insulating layer 16 is then formed on the storage node electrode 15, and a polysilicon layer 17 is formed on the insulating layer 16. The insulating layer 16 can be an oxide layer having a thickness in the range of 100 Angstroms to 1,000 Angstroms, and the polysilicon layer 17 can have a thickness in the range of 100 Angstroms to 700 Angstroms. The insulating layer 16 can be formed using a chemical vapor deposition (CVD) step, a low pressure chemical vapor deposition (LPCVD) step, or an oxidation step. The polysilicon layer 17 is used to facilitate the formation of a rugged surface on the storage node electrode 15. Alternately, an amorphous silicon layer can be used to provide the layer 17.

Figure 1C:
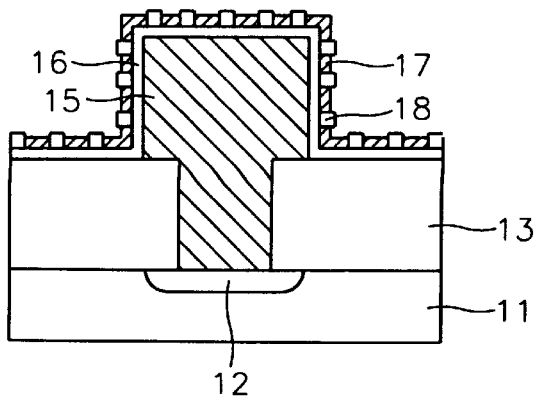

The polysilicon layer 17 is then subjected to a $POCl_3$ doping step thereby forming the oxide runners 18 along grain boundaries between the grains of the polysilicon layer 17. After the $POCl_3$ doping, the sheet resistance Rs of the polysilicon layer 17 can be in the range of 30 $\Omega/\square$ to 100 $\Omega/\square$. The oxide runners 18 can include oxides such as $SiO_2$ and/or $P_2O_5$. As shown in FIG. 1C, each of the oxide runners 18 appears as an oxide projection, and the projections are preferably grown perpendicular with respect to the insulating layer 16 during the $POCl_3$ doping.

With heavier $POCl_3$ doping, the oxide layer 18 may grow further. The sizes of the oxide runners 18 can be controlled during the $POCl_3$ doping step by controlling the deposition temperature when forming the polysilicon layer 17, the thickness of the polysilicon layer 17, and the temperature and time of the $POCl_3$ doping step.

Figure 1D:
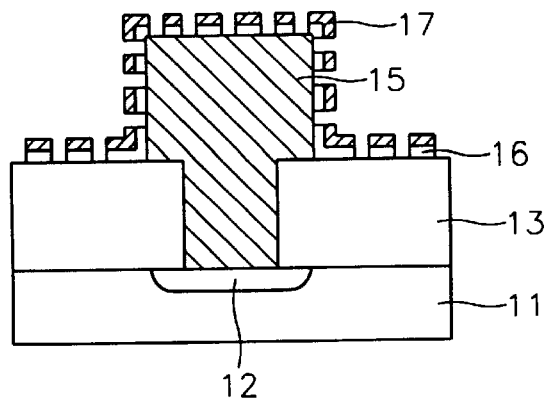

The structure is then subjected to a wet and/or a dry etch to remove the oxide runners 18 and the portions of the insulating layer 16 under the oxide runners 18 as shown in FIG. 1D. Portions of the storage node electrode 15 corresponding to the oxide runners 18 are thus exposed. The remaining portions of the insulating layer 16 thus provide an etch masking pattern including a plurality of islands on the surface of the storage node electrode 15. The sizes of these etch masking pattern islands can be controlled by adjusting the duration of the etch discussed above and by controlling the sizes of the oxide runners.

Figure 1E:
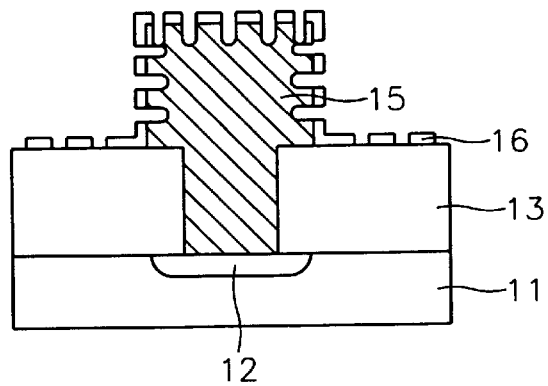

The exposed portions of the storage node electrode 15 are then etched using the etch masking pattern as an etching mask as shown in FIG. 1E. This same etch can be used to remove portions of the polysilicon layer 17 remaining on the etch masking patter. Accordingly, recesses are formed in portions of the storage node electrode 15 exposed during this etch. Stated in other words, pillars are formed adjacent the etch masking pattern islands.

Figure 1F:
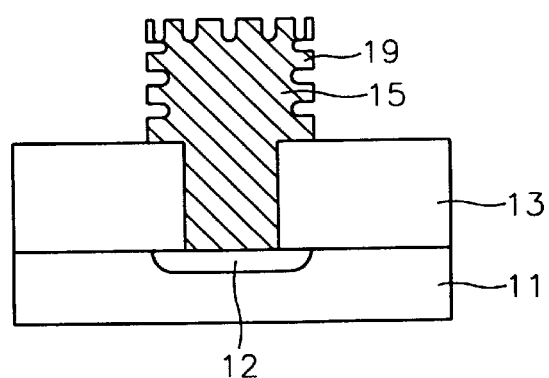

The remaining portions of the oxide layer 16 (etch masking pattern islands) are removed using a wet and/or a dry etch as shown in FIG. 1F.

Accordingly, a plurality of recesses and pillars are formed on the surface of the storage node electrode 15. Stated in other words, the storage node electrode 15 has a rugged surface resulting from the projections (or pillars) and recesses thus formed. The depth of each recess (or height of each pillar) can be controlled by adjusting the duration of the etch used on the storage node electrode 15, the duration of the etch used to remove the oxide runners 18 and the adjacent portions of the insulating layer 16, and the duration of the $POCl_3$ doping step performed on the polysilicon layer 17. When etching the polysilicon layer 17, the insulating layer 16 can provide an etch stop.

Figure 1G:
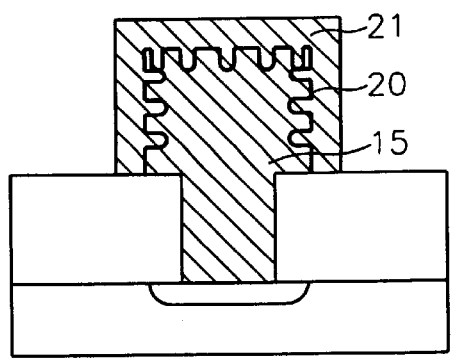

A dielectric layer 20 is formed on the storage node electrode 15 and a plate electrode 21 is formed on the dielectric layer 20 as shown in FIG. 1G. A capacitor for an integrated circuit device can thus be provided.

As discussed above, a method of forming a capacitor according to the present invention provides a rugged surface for a capacitor electrode by using a $POCl_3$ doping step. Accordingly, projections (or pillars) on the rugged surface of the capacitor electrode can be doped during the $POCl_3$ doping step. The conductivity of these projections can thus be increased without adding an additional doping step. In addition, the surface area of the storage node electrode can be increased as a result of the rugged surface thereby increasing the capacitance of the resulting capacitor.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a capacitor for an integrated circuit device, said method comprising, the steps of:

forming an electrode on an integrated circuit substrate;

forming an etch masking pattern comprising a plurality of islands on a surface of said electrode wherein said etch masking pattern exposes portions of said surface of said electrode wherein said step of forming said etch masking pattern comprises the steps of, forming a masking layer on said surface of said electrode, forming a silicon layer on said masking layer opposite said electrode, forming a plurality of oxide runners along grain boundaries of said silicon layer, selectively removing said oxide runners thereby exposing portions of said masking layer along said grain boundaries, and etching said exposed portions of said masking layer thereby exposing said portions of said surface of said electrode;

etching said exposed portions of said surface of said electrode using said etch masking pattern as an etching mask so that recesses are formed in said surface of said electrode thereby increasing a surface area of said electrode;

removing said etch masking pattern;

forming a dielectric layer on said electrode including said recesses; and forming a conductive layer on said dielectric layer opposite said electrode.

2. A method according to claim 1 wherein said step of forming said plurality of oxide runners comprises a $POCl_3$ doping step.

3. A method according to claim 2 wherein each of said oxide runners is grown perpendicularly with respect to said masking layer.

4. A method according to claim 1 wherein said step of etching said exposed portion of said masking layer comprises one of a wet etch step or a dry etch step.

5. A method according to claim 1 wherein said masking layer comprises an oxide layer.

6. A method according to claim 1 wherein said step of removing said oxide runners comprises one of a wet etch step or a dry etch step.

7. A method according to claim 1 wherein said silicon layer comprises one of a polysilicon layer or an amorphous silicon layer.

8. A method according to claim 1 wherein said oxide runners comprise a material chosen from the group consisting of $SiO_2$ and $P_2O_5$.

9. A method according to claim 1 wherein said silicon layer has a sheet resistance in the range of 30 ohms/square to 100 ohms/square after said step of forming said oxide runners.

10. A method of forming an electrode having a rough surface for an integrated circuit device, said method comprising the steps of:

forming an electrode on an integrated circuit substrate;

forming an etch masking pattern comprising a plurality of islands on a surface of said electrode wherein said etch masking pattern exposes portions of said surface of said electrode wherein said step of forming said etch masking pattern comprises the steps of, forming a masking layer on said surface of said electrode, forming a silicon layer on said masking layer opposite said electrode, forming a plurality of oxide runners along grain boundaries of said silicon layer, selectively removing said oxide runners thereby exposing portions of said masking layer along said grain boundaries, and etching said exposed portions of said masking layer thereby exposing said portions of said surface of said electrode; and etching said exposed portions of said surface of said electrode using said etch masking pattern as an etching mask so that recesses are formed in said surface of said electrode thereby increasing a surface area of said electrode.

11. A method according to claim 10 wherein said step of forming said plurality of oxide runners comprises a $POCl_3$ doping step.

12. A method according to claim 11 wherein each of said oxide runners is grown perpendicularly with respect to said masking layer.

13. A method according to claim 10 wherein said step of etching said exposed portion of said masking layer comprises one of a wet etch step or a dry etch step.

14. A method according to claim 10 wherein said masking layer comprises an oxide layer.

15. A method according to claim 10 wherein said step of removing said oxide runners comprises one of a wet etch step or a dry etch step.

16. A method according to claim 10 wherein said silicon layer comprises one of a polysilicon layer or an amorphous silicon layer.

17. A method according to claim 10 wherein said oxide runners comprise a material chosen from the group consisting of $SiO_2$ and $P_2O_5$.

18. A method according to claim 10 wherein said silicon layer has a sheet resistance in the range of 30 ohms/square to 100 ohms/square after said step of forming said oxide runners.

19. A method according to claim 10 further comprising the steps of:

removing said etch masking pattern;

forming a dielectric layer on said electrode including said recesses; and forming a conductive layer on said dielectric layer opposite said electrode.

20. A method according to claim 10 wherein said step of forming said electrode is preceded by the step of:

forming an insulating layer on said integrated circuit substrate wherein said insulating layer has a contact hole therein exposing a portion of said substrate and wherein said electrode is electrically coupled to said substrate through said contact hole.

21. A method of forming an integrated circuit memory device, said method comprising the steps of:

forming a memory cell access transistor on a semiconductor substrate wherein said memory cell access transistor includes a source/drain region on said semiconductor substrate;

forming an insulating layer on said semiconductor substrate and on said memory cell access transistor wherein said insulating layer has a contact hole therein exposing a portion of said source/drain region;

forming an electrode on said insulating layer adjacent said contact hole wherein said electrode is electrically coupled to said source/drain region through said contact hole;

forming an etch masking pattern comprising a plurality of islands on a surface of said electrode wherein said etch masking pattern exposes portions of said surface of said electrode wherein said step of forming said etch masking pattern comprises the steps of, forming a masking layer on said surface of said electrode, forming a silicon layer on said masking layer opposite said electrode, forming a plurality of oxide runners along grain boundaries of said silicon layer, selectively removing said oxide runners thereby exposing portions of said masking layer along said grain boundaries, and etching said exposed portions of said masking layer thereby exposing said portions of said surface of said electrode;

etching said exposed portions of said surface of said electrode using said etch masking pattern as an etching mask so that recesses are formed in said surface of said electrode thereby increasing a surface area of said electrode;

removing said etch masking pattern;

forming a dielectric layer on said electrode including said recesses; and forming a conductive layer on said dielectric layer opposite said electrode.

22. A method according to claim 21 wherein said step of forming said plurality of oxide runners comprises a $POCl_3$ doping step.

23. A method according to claim 22 wherein each of said oxide runners is grown perpendicularly with respect to said masking layer.

24. A method according to claim 21 wherein said step of etching said exposed portion of said masking layer comprises one of a wet etch step or a dry etch step.

25. A method according to claim 21 wherein said masking layer comprises an oxide layer.

26. A method according to claim 21 wherein said step of removing said oxide runners comprises one of a wet etch step or a dry etch step.

27. A method according to claim 21 wherein said silicon layer comprises one of a polysilicon layer or an amorphous silicon layer.

28. A method according to claim 21 wherein said oxide runners comprise a material chosen from the group consisting of $SiO_2$ and $P_2O_5$.

29. A method according to claim 21 wherein said silicon layer has a sheet resistance in the range of 30 ohms/square to 100 ohms/square after said step of forming said oxide runners.

30. A method according to claim 1 wherein said electrode covers a first portion of said integrated circuit substrate and wherein said electrode exposes a second portion of said integrated circuit substrate.

31. A method according to claim 10 wherein said electrode covers a first portion of said integrated circuit substrate and wherein said electrode exposes a second portion of said integrated circuit substrate.

32. A method according to claim 21 wherein said electrode covers a first portion of said insulating layer and wherein said electrode exposes a second portion of said insulating layer.

* * * * *